United States Patent
Wong et al.

(10) Patent No.: US 9,412,835 B2
(45) Date of Patent: Aug. 9, 2016

(54) RECTIFIER STRUCTURES WITH LOW LEAKAGE

(71) Applicant: Taiwan Semiconductor Manufacturing Company, Ltd., Hsin-Chu (TW)

(72) Inventors: King-Yuen Wong, Tuen Mun (HK); Chen-Ju Yu, Jiaoxi Township (TW); Jiun-Lei Jerry Yu, Zhudong Township (TW); Po-Chih Chen, Hsin-Chu (TW); Fu-Wei Yao, Hsin-Chu (TW); Fu-Chih Yang, Fengshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/790,588

(22) Filed: Jul. 2, 2015

(65) Prior Publication Data

US 2015/0325679 A1 Nov. 12, 2015

Related U.S. Application Data

(63) Continuation of application No. 14/144,716, filed on Dec. 31, 2013, now Pat. No. 9,111,956.

(60) Provisional application No. 61/785,009, filed on Mar. 14, 2013.

(51) Int. Cl.
*H01L 21/82* (2006.01)
*H01L 29/66* (2006.01)
(Continued)

(52) U.S. Cl.
CPC .... *H01L 29/66462* (2013.01); *H01L 21/26546* (2013.01); *H01L 21/28264* (2013.01); *H01L 21/308* (2013.01); *H01L 21/30604* (2013.01); *H01L 21/31111* (2013.01); H01L 21/31144 (2013.01); *H01L 21/8252* (2013.01); *H01L 27/0605* (2013.01); *H01L 29/401* (2013.01); *H01L 29/42364* (2013.01); *H01L 29/66621* (2013.01); *H01L 29/7787* (2013.01); *H01L 29/2003* (2013.01)

(58) Field of Classification Search
CPC ............... H01L 29/66462; H01L 21/31111; H01L 29/401; H01L 29/42364; H01L 21/31144; H01L 29/66621; H01L 21/308; H01L 21/26546; H01L 21/28264; H01L 21/30604; H01L 27/0605; H01L 21/8252; H01L 29/7787
See application file for complete search history.

(56) References Cited

U.S. PATENT DOCUMENTS 8,603,880 B2 * 12/2013 Yamada ............... H01L 29/2003
257/192
2002/0121647 A1 * 9/2002 Taylor ................... B82Y 20/00
257/192

(Continued)

OTHER PUBLICATIONS

Bandic, Z.Z. et al., "High voltage (450 V) GaN Schottky rectifiers," Applied Physics Letters, 74, 1266, Mar. 1, 1999, 3 pages.
(Continued)

*Primary Examiner* — Roy Potter
*Assistant Examiner* — Paul Patton
(74) *Attorney, Agent, or Firm* — Slater Matsil, LLP

(57) ABSTRACT

An integrated circuit device includes a first III-V compound layer, a second III-V compound layer over the first III-V compound layer, a gate dielectric over the second III-V compound layer, and a gate electrode over the gate dielectric. An anode electrode and a cathode electrode are formed on opposite sides of the gate electrode. The anode electrode is electrically connected to the gate electrode. The anode electrode, the cathode electrode, and the gate electrode form portions of a rectifier.

20 Claims, 12 Drawing Sheets

(51) Int. Cl.
  *H01L 21/265*  (2006.01)
  *H01L 21/311*  (2006.01)
  *H01L 21/306*  (2006.01)
  *H01L 21/308*  (2006.01)
  *H01L 29/423*  (2006.01)
  *H01L 29/40*   (2006.01)
  *H01L 21/28*   (2006.01)
  *H01L 29/778*  (2006.01)
  *H01L 21/8252* (2006.01)
  *H01L 27/06*   (2006.01)
  *H01L 29/20*   (2006.01)

(56) References Cited

U.S. PATENT DOCUMENTS

| | | |
|---|---|---|
| 2010/0012977 A1 | 1/2010 | Derluyn et al. |
| 2011/0227090 A1 | 9/2011 | Briere |
| 2012/0056191 A1 | 3/2012 | Endo et al. |
| 2012/0205662 A1* | 8/2012 | Nakamura ......... H01L 29/4236 257/76 |
| 2013/0112986 A1 | 5/2013 | Hsiung et al. |
| 2014/0203288 A1* | 7/2014 | Hsiung ............... H01L 29/7787 257/76 |

OTHER PUBLICATIONS

Irokawa, Y. et al., "Current-voltage and reverse recovery characteristics of bulk GaN p-i-n rectifiers," Applied Physics Letters, 83, 2271, Sep. 2003, 3 pages.

Wanjun, Chen et al., "High-performance AlGaN/GaN lateral field-effect rectifiers compatible with high electron mobility transistors," Applied Physics Letters, 92, 253501, Jun. 25, 2008, 3 pages.

Zhang, A.P. et al., "Vertical and lateral GaN rectifiers on free-standing GaN substrates," Applied Physics Letters, 79, 1555, Sep. 2001, 3 pages.

* cited by examiner

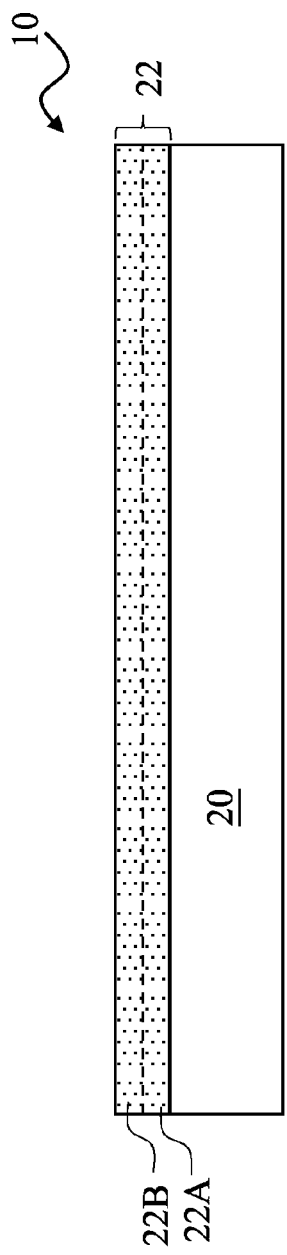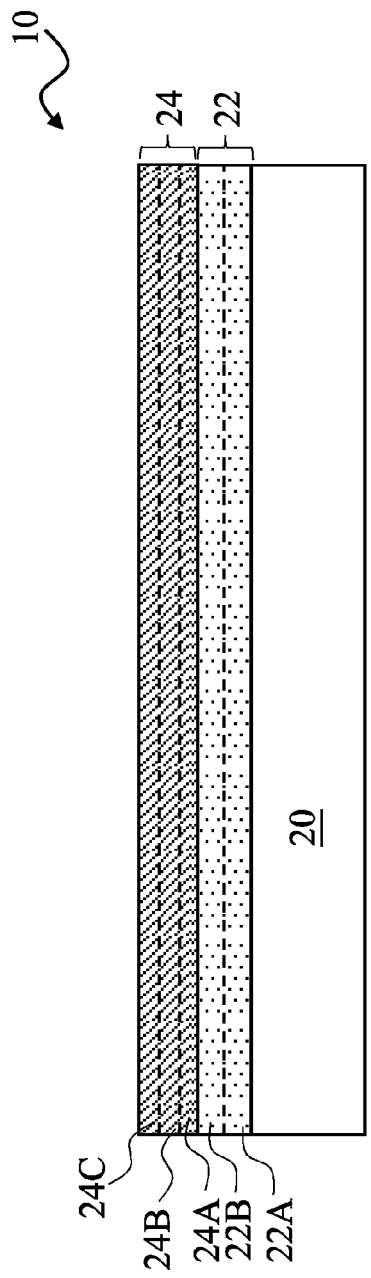

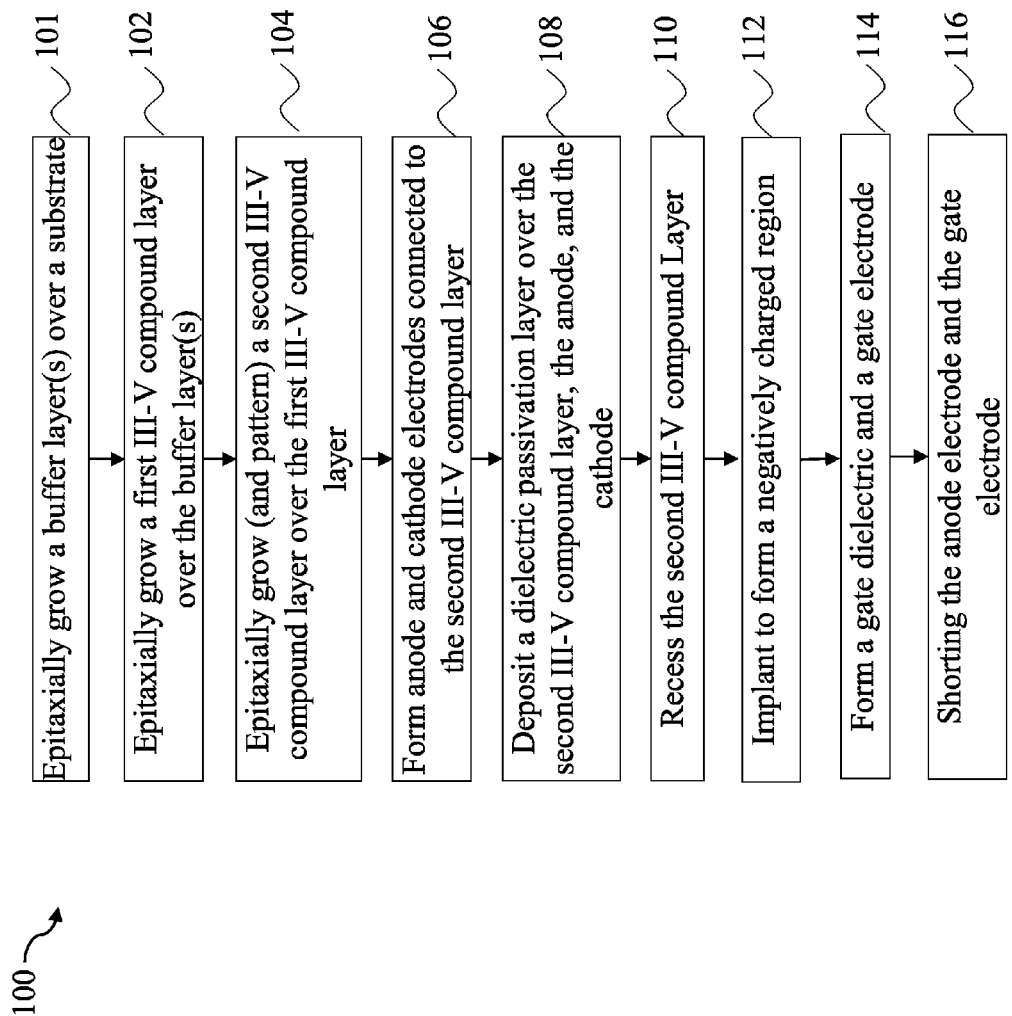

RECTIFIER STRUCTURES WITH LOW LEAKAGE

This is a continuation of U.S. patent application Ser. No. 14/144,716, entitled "Rectifier Structures with Low Leakage," filed Dec. 31, 2013 which application claims the benefit of the following provisionally filed U.S. patent application Ser. No. 61/785,009, filed Mar. 14, 2013, and entitled "AlGaN/GaN Rectifier and Method of Forming the Same," which applications are hereby incorporated herein by reference.

BACKGROUND

Both rectifiers and transistors are essential components in high-voltage power electronics applications, for example, switching-mode power supplies and many forms of drive circuits. Rectifiers are commonly used to convert an Alternating Current (AC), which periodically reverses direction, to Direct Current (DC), which flows in a single direction. The respective conversion process is known as rectification. Rectifiers have various types including semiconductor diodes and Silicon-Controlled Rectifiers (SCRs).

In semiconductor technology, due to their characteristics, Group III-Group V (or III-V) semiconductor compounds are used to form various integrated circuit devices, such as high power field-effect transistors, high frequency transistors, or High Electron Mobility Transistors (HEMTs). A HEMT is a field effect transistor incorporating a junction between two materials with different band gaps (i.e., a heterojunction) as the channel instead of a doped region, as is generally the case for Metal-Oxide Semiconductor Field-Effect Transistors (MOSFETs). In contrast with the MOSFETs, the HEMTs have a number of attractive properties including high electron mobility, the ability to transmit signals at high frequencies, etc.

From the application point of view, Enhancement-mode (E-mode) HEMTs have many advantages. E-mode HEMTs allow for the elimination of negative-polarity voltage supply, and, therefore, the reduction in the circuit complexity and cost. Despite the attractive properties noted above, a number of challenges exist in connection with developing III-V semiconductor compound-based devices. Various techniques directed to configurations and materials of these III-V semiconductor compounds have been implemented to try and further improve transistor device performance.

For rectifiers, two-terminal power rectifiers with low forward turn-on voltages, low on-resistance, and high reverse breakdown voltages (BV) are desirable in high-voltage power electronics, e.g. in switching-mode power supplies and power factor correction circuits. Low on-state resistance and short reverse recovery time, for a given off-state breakdown voltage, are important for power conversion efficiency.

Various efforts have been made to improve the performance of power rectifiers. Some proposed structures include Junction Barrier Schottky diodes, Merged p-i-n Schottky (MPS) diodes, and synchronous rectifiers. Other proposed rectifiers include Schottky Barrier Diodes (SBDs) and p-i-n diodes on doped bulk GaN, which presents high-breakdown and low-on-resistance features.

However, since the epitaxial structures for SBD or p-i-n diodes are not compatible with the HEMT structures, the SBD or p-i-n diode rectifiers have not been successfully integrated with HEMTs (at least not without unacceptable performance loss). Although SBDs can be directly formed on AlGaN/GaN heterostructures, the series combination of the AlGaN/GaN heterojunction with the metal-AlGaN Schottky barrier results in higher turn-on voltages and higher on-resistances.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 11 are cross-sectional views of intermediate stages in the manufacturing of a rectifier in accordance with some exemplary embodiments;

FIG. 13 illustrates a schematic process flow for forming the rectifier in accordance with exemplary embodiments.

DETAILED DESCRIPTION OF ILLUSTRATIVE EMBODIMENTS

Figure 3:
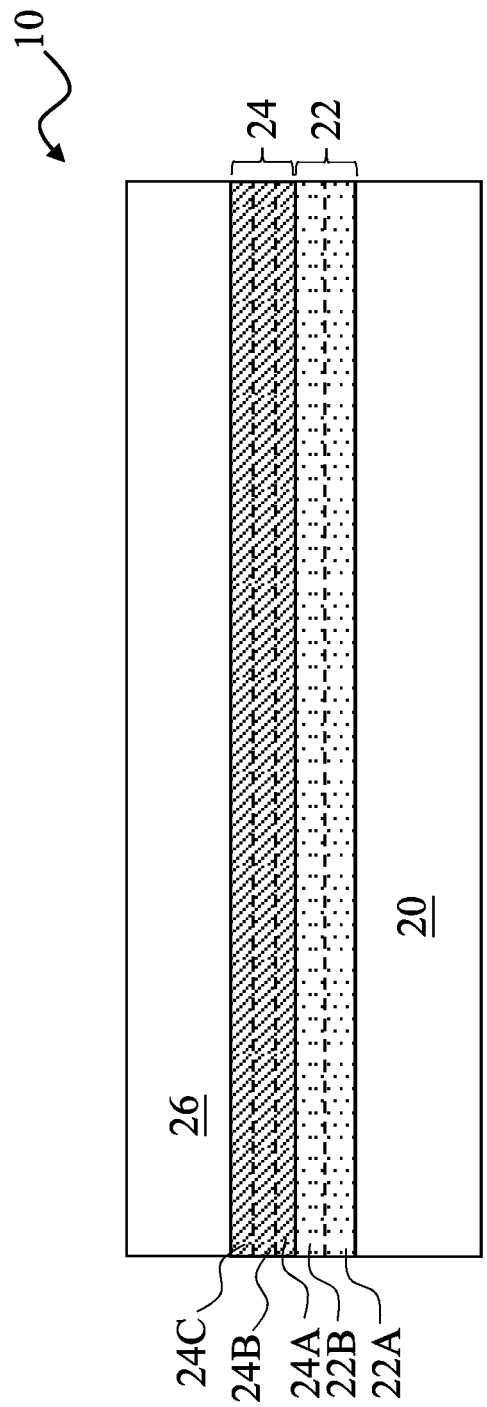

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A rectifier and the method of forming the same are provided in accordance with various exemplary embodiments. The intermediate stages of forming the rectifier are illustrated. The variations of the embodiments are discussed. Throughout the various views and illustrative embodiments, like reference numbers are used to designate like elements.

FIGS. 1 through 11 illustrate the cross-sectional views of intermediate stages in the formation of a rectifier in accordance with exemplary embodiments. In the illustrated exemplary embodiments, the rectifier is formed using a gate-last approach, in which a gate electrode is formed after the formation of an anode electrode and a cathode electrode. In alternative embodiments, the rectifier may also be formed using a gate-first approach, in which a gate electrode is formed before the formation of anode and cathode electrodes. Referring to FIG. 1, which is a cross-sectional view of a portion of substrate 20, substrate 20 is provided. Substrate 20 may be a part of wafer 10. In some embodiments, substrate 20 includes a silicon carbide (SiC) substrate, a sapphire substrate, a silicon substrate, or the like. Substrate 20 may be a bulk substrate formed of a bulk material, or may be a composite substrate including a plurality of layers that are formed of different materials.

In accordance with some embodiments, buffer layer 22 is first formed over substrate 20, which acts as the buffer and/or the transition layer for the subsequently formed overlying layers. The respective step is shown as step 101 in FIG. 13. Buffer layer 22 may be epitaxially grown using Metal Organic Vapor Phase Epitaxy (MOVPE). Buffer layer 22 may function as an interface to reduce lattice mismatch between substrate 20 and the subsequently formed III-V compound layers 26 (FIG. 3) and 28 (FIG. 4). In some embodiments, buffer layer 22 includes an aluminum nitride (AlN) layer having a thickness in a range between about 10 nanometers (nm) and about 300 nm. Buffer layer 22 may include a single layer or a plurality of layers. For example, buffer layer 22 may include low-temperature AlN layer 22A formed at a temperature between about 800° C. and about 1,200° C., and high-temperature AlN layer 22B formed at a temperature between about 1,000° C. and about 1,400° C. In some embodiments, buffer layer 22A has a thickness in a range between about 10 nanometers (nm) and about 100 nm, and buffer layer 22B has a thickness in a range between about 100 nanometers (nm) and about 200 nm.

Referring to FIG. 2, III-V compound layer 24 is formed over buffer layer 22. The respective step is also shown as step 101 in FIG. 13. III-V compound layer 24 may also act as a buffer layer, and hence is referred to as buffer layer 24 hereinafter. Buffer layer 24 can be epitaxially grown using MOVPE, for example. Buffer layer 24 may include an aluminum gallium nitride (AlGaN) layer, which may have a thickness in a range from about 500 nm to about 1,000 nm. Buffer layer 24 may be a graded buffer layer, which means that the relative amounts of the respective aluminum and/or gallium content change with depth in the layer throughout a part or the total thickness of buffer layer 24. The relative amounts may change gradually to reduce the lattice parameter with the distance from substrate 20. For example, FIG. 2 schematically illustrated three sub layers 24A, 24B, and 24C, with the percentages of aluminum and/or gallium in sub layers 24A, 24B, and 24C different from each other. In some exemplary embodiments, sub layer 24A has an aluminum percentage between about 65 percent and about 85 percent, sub layer 24B has an aluminum percentage between about 35 percent and about 60 percent, and sub layer 24C has an aluminum percentage between about 10 percent and about 30 percent.

Figure 4:
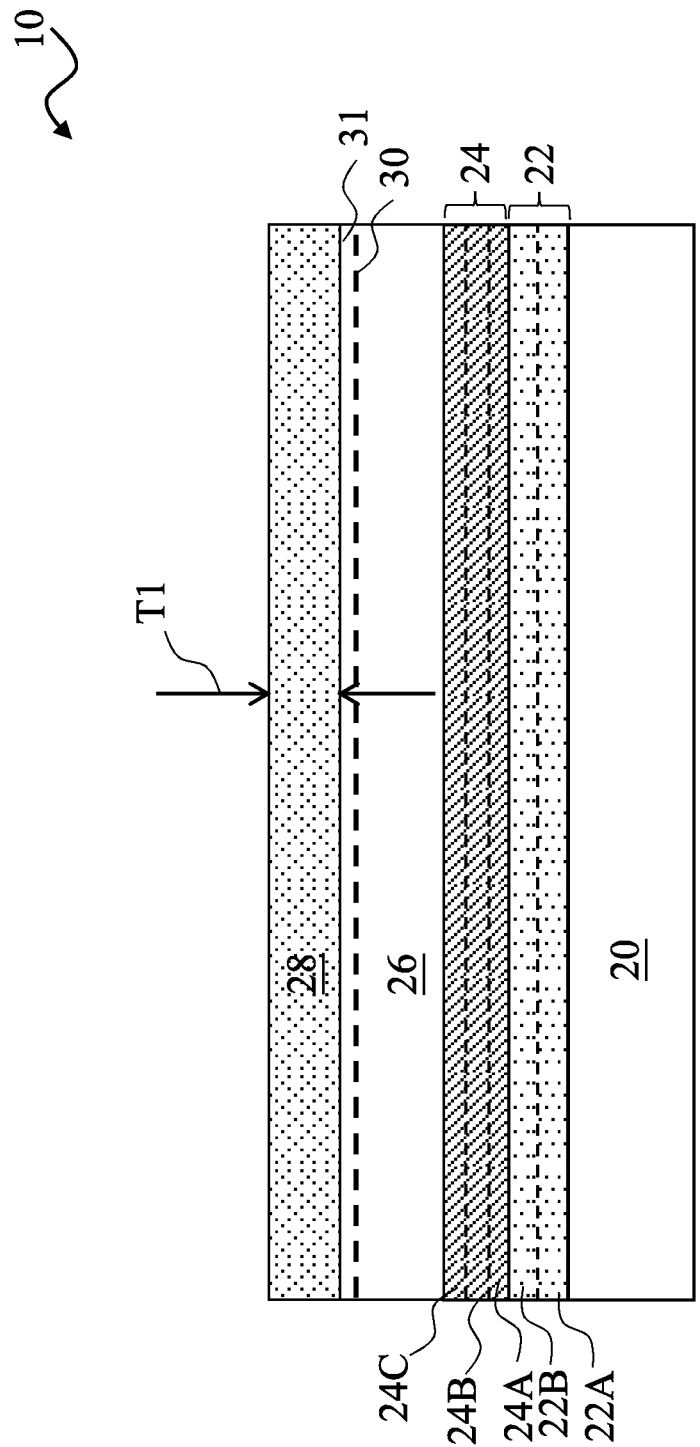

Referring to FIG. 3, first III-V compound layer 26 is grown over buffer layer 24 (step 102 in FIG. 13). In some embodiments, III-V compound layer 26 is a gallium nitride (GaN) layer. GaN layer 26 may be epitaxially grown by using, for example, MOVPE, during which a gallium-containing precursor and a nitrogen-containing precursor are used. The gallium-containing precursor may include trimethylgallium (TMG), triethylgallium (TEG), or other suitable gallium-containing chemicals. The nitrogen-containing precursor may include ammonia ($NH_3$), tertiarybutylamine (TBAm), phenyl hydrazine, or other suitable chemicals. In some exemplary embodiments, III-V compound layer 26 has a thickness ranging from about 0.5 micron to about 10 microns. III-V compound layer 26 may be undoped. Alternatively, III-V compound layer 26 is unintentionally doped, such as lightly doped with n-type dopants due to a precursor used for forming III-V compound layer 26, with no dopant that may cause III-V compound layer 26 to be n-type or p-type intentionally added.

Referring to FIG. 4, a second III-V compound layer 28 is grown on, and may contact, III-V compound layer 26. The respective step is shown as step 104 in FIG. 13. III-V compound layer 28 has a band gap higher than the band gap of III-V compound layer 26. Interface 31 is formed between III-V compound layer 26 and III-V compound layer 28. When the respective rectifier is operated, carrier channel 30, which is known as a Two-Dimensional Electron Gas (2DEG), is formed and located in III-V compound layer 26 near interface 31. In some embodiments, III-V compound layer 28 is an AlGaN layer.

III-V compound layer 28 may be epitaxially grown over III-V compound layer 26 through MOVPE, for example. When formed of AlGaN, III-V compound layer 28 may be grown using an aluminum-containing precursor, a gallium-containing precursor, and a nitrogen-containing precursor. The aluminum-containing precursor may include trimethylaluminum (TMA), triethylaluminium (TEA), or other suitable chemicals. The gallium-containing precursor and the nitrogen-containing precursor may be selected from the same candidate precursors used for forming GaN layer 26. In some exemplary embodiments, AlGaN layer 28 may have thickness T1 ranging from about 2 nm to about 50 nm.

Figure 5:
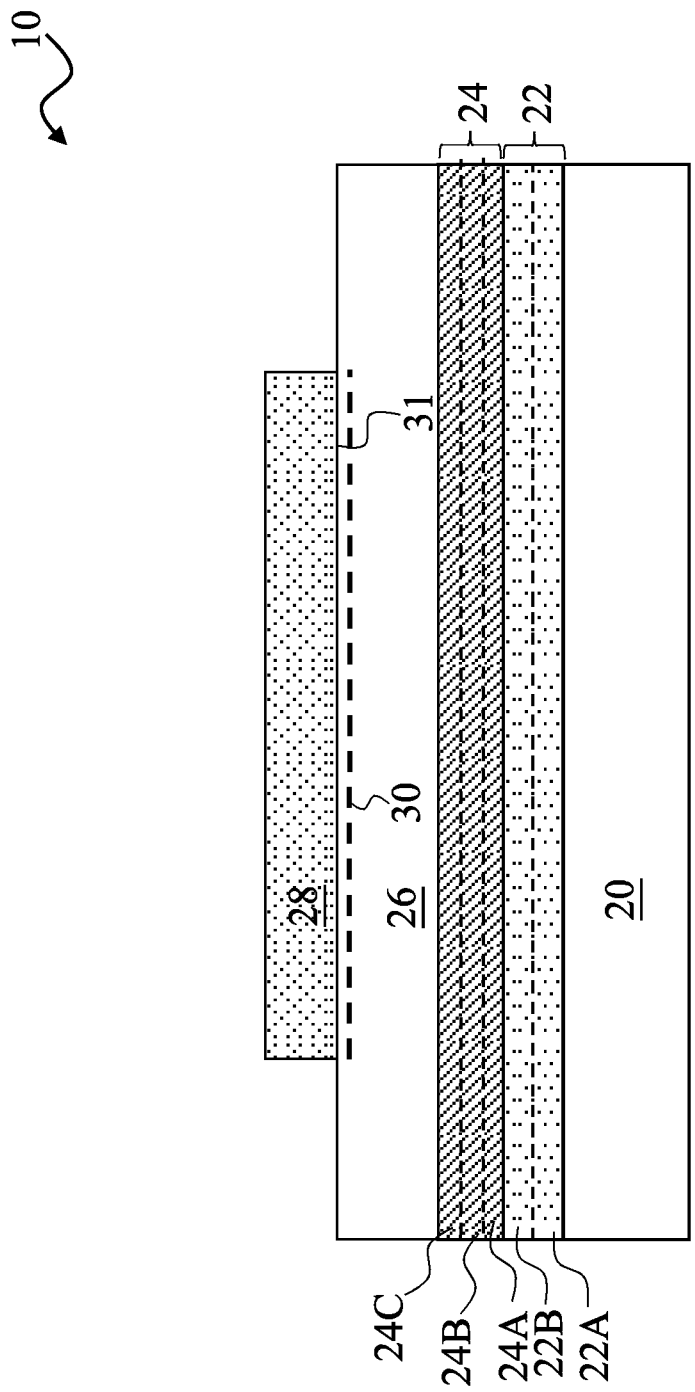
Figure 6:
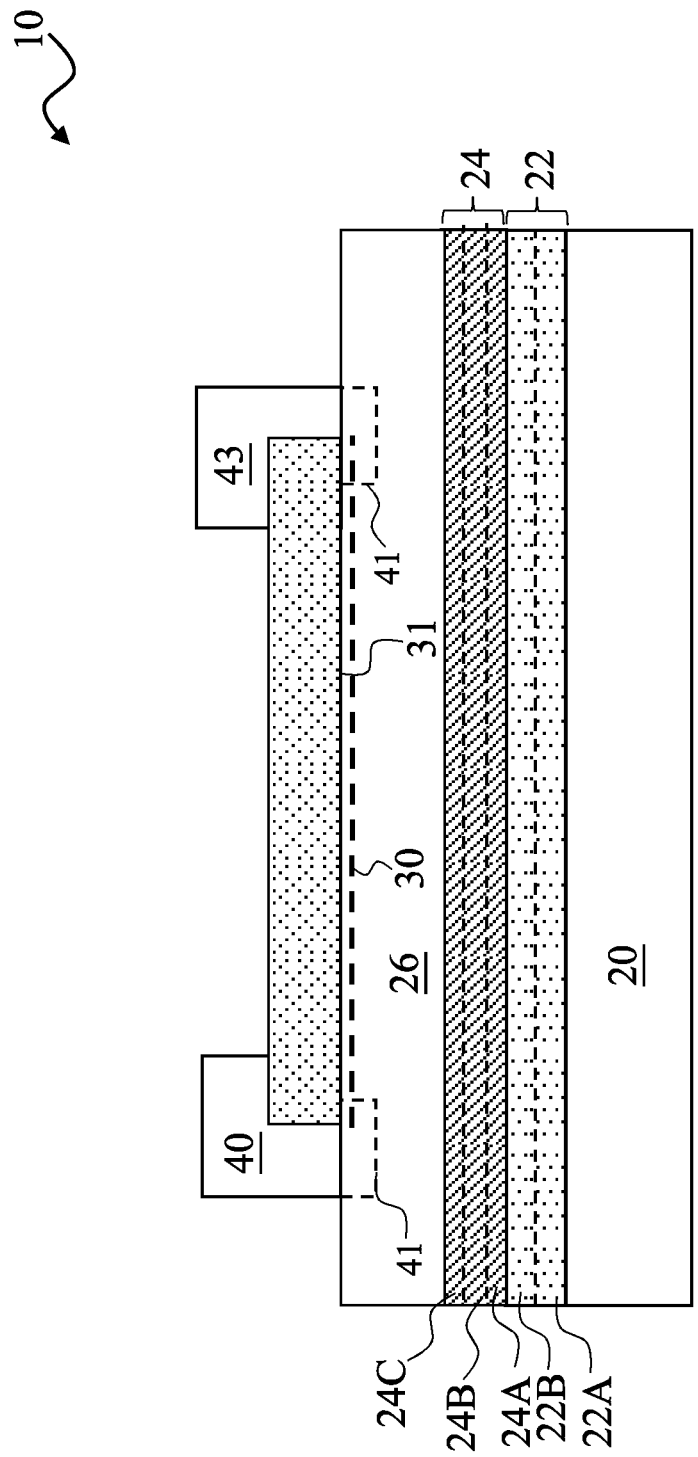

FIG. 5 illustrates the patterning (step 104 in FIG. 13) of III-V compound layer 28, for example, through an etch step. As a result, some portions of III-V compound layer 26 are exposed. Next, as shown in FIG. 6, anode electrode 40 and cathode electrode 43 are formed (step 106 in FIG. 13) to connect to the opposite end portions of the remaining III-V compound layer 28, for example, by a deposition followed by a lithography and etching processes.

In some embodiments, anode electrode 40 and cathode electrode 43 include one or more conductive materials. For example, anode electrode 40 and cathode electrode 43 may comprise Ti, Co, Ni, W, Pt, Ta, Pd, Mo, TiN, an AlCu alloy, and alloys thereof. In other examples, each of anode electrode 40 and cathode electrode 43 includes a bottom Ti/TiN layer, an AlCu layer overlying the bottom Ti/TiN layer, and a top Ti layer overlying the AlCu layer. The formation methods of the metal layer include ALD or PVD processes. In some embodiments, a thermal annealing process is applied to anode electrode 40 and cathode electrode 43 such that anode electrode 40 and cathode electrode 43 react with III-V compound layer 26 to form inter-metallic compound 41. Furthermore, anode electrode 40 and cathode electrode 43 may also react with III-V compound layer 28 to form an inter-metallic compound (not shown), which is at the interface region between anode/cathode electrodes 40/43 and III-V compound layer 28. Inter-metallic compound 41 connects to the opposite ends of 2DEG channel 30, and provides for more effective electrical connection to 2DEG channel 30.

Figure 7:
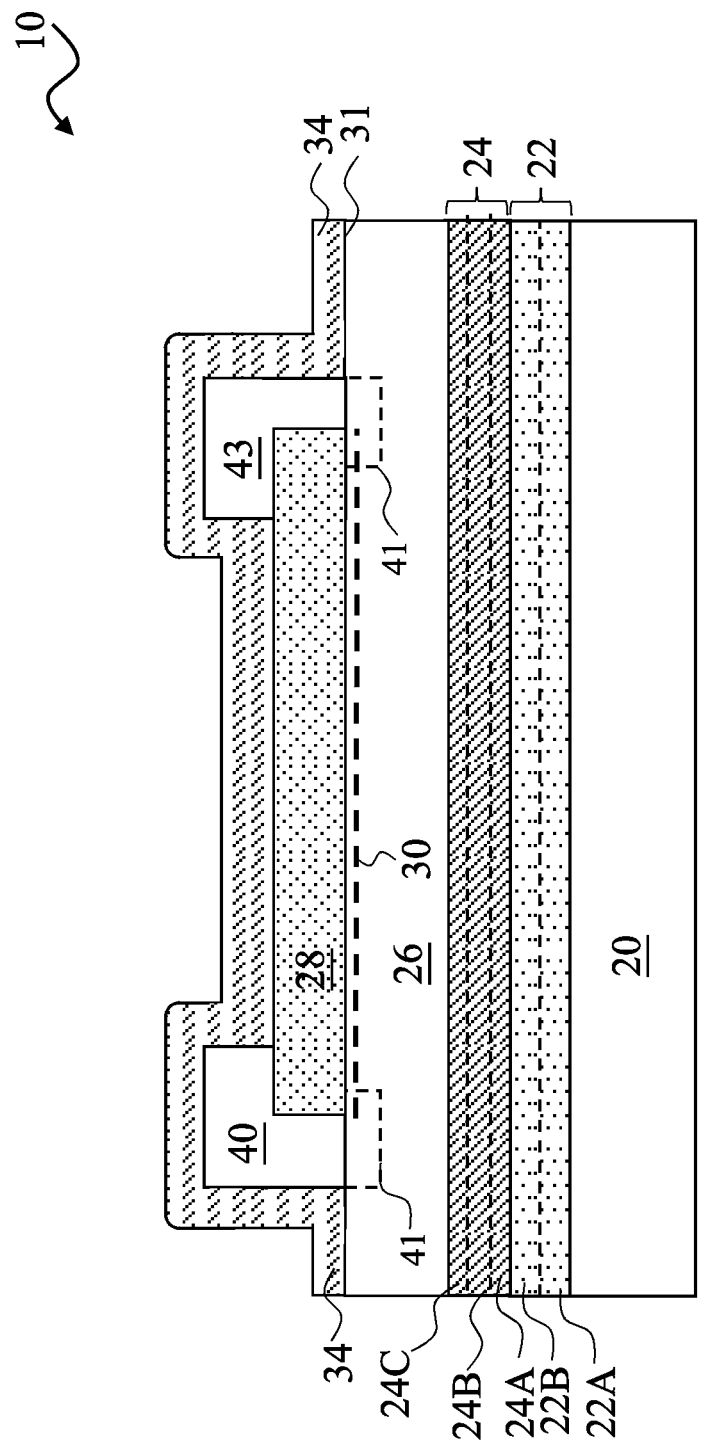

Next, as shown in FIG. 7, dielectric passivation layer 34 is deposited (step 108 in FIG. 13) over, and possibly contacting, the exposed surfaces of III-V compound layers 26 and 28 and anode electrode 40 and cathode electrode 43. In some exemplary embodiments, dielectric passivation layer 34 has a thickness in a range between about 100 Å and about 5,000 Å. An exemplary dielectric passivation layer 34 includes silicon oxide and/or silicon nitride. When comprising silicon nitride, dielectric passivation layer 34 may be formed by performing a Low-Pressure Chemical Vapor Deposition (LPCVD) method (without plasma) using $SiH_4$ and $NH_3$ gases. Dielectric passivation layer 34 protects the underlying III-V compound layers 26 and 28 from the damage caused by plasma, which plasma is generated in subsequent process steps.

Figure 8:
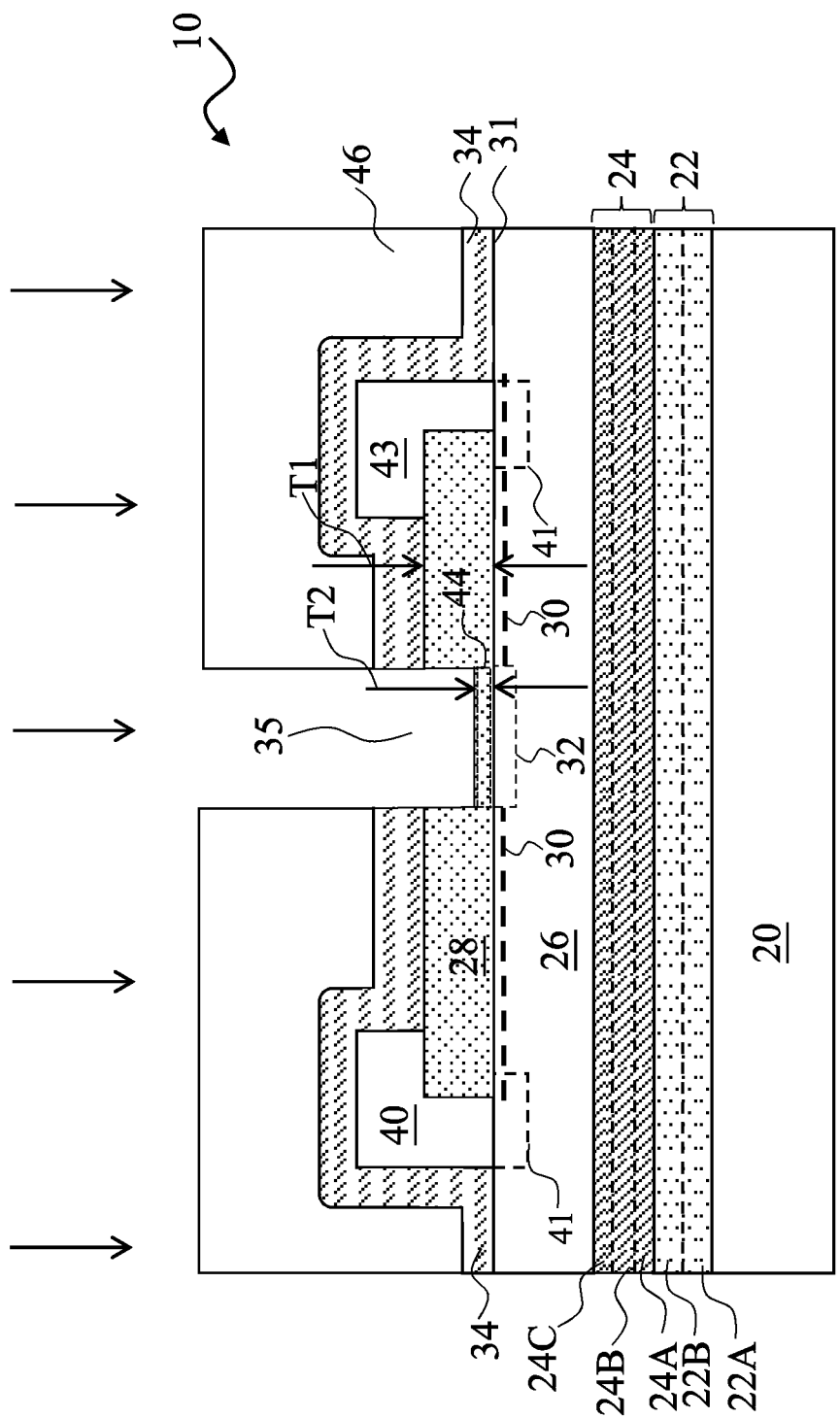

Next, referring to FIG. 8, opening 35 is formed in dielectric passivation layer 34, for example, through etching (step 110 in FIG. 13). Photo resist 46 is formed and patterned, so that a portion of dielectric passivation layer 34 is exposed, which portions is between anode electrode 40 and cathode electrode 43. A portion of the top surface of III-V compound layer 28 is thus exposed. In some examples, dielectric passivation layer 34 comprises silicon nitride, and opening 35 is formed in a dry etching environment including $BCl_3$, for example, as the etchant gas.

In some embodiments, after the exposure of III-V compound layer 28, an etch step (also step 110 in FIG. 13) is performed to etch III-V compound layer 28, and hence opening 35 extends down into III-V compound layer 28 to form a recess in III-V compound layer 28. Photo resist 46 is disposed and patterned to act as an etching mask. The recess is also denoted as recess 35. The thickness of the portion of III-V compound layer 28 under recess 35 is reduced from T1 to T2. Thickness T2 may be smaller than about 30 Å. Furthermore, the recessing depth (T1-T2) of III-V compound layer 28 may be greater than about 20 Å. Ratio T2/T1 may also be smaller than about ⅓. The recessing of III-V compound layer 28 is used to modulate the threshold voltage of the resulting rectifier. In some embodiments, the etching is performed using a fluorine-based gas (such as $CF_4$, $SF_6$, or $C_3F_8$) as an etching gas, although other applicable etching gases may also be used. The etching may be performed using a tool for performing Reactive Ion Etching (RIE), a tool configured to generate Inductively Coupled Plasma (ICP), or the like. The flow rate of the etching gas may be between about 10 sccm and about 100 sccm.

Furthermore, after the exposure of III-V compound layer 28, an implantation (step 112 in FIG. 13) may be performed to introduce an impurity into the exposed portion of III-V compound layer 28, so that negatively charged region 44 is formed. Negatively charged region 44 has the effect of expelling electrons from the underlying portion of 2DEG channel 30, and hence has the effect of modulating the threshold voltage of the resulting rectifier. The doping concentration of negatively charged region 44 and the depth of recess 35 are adjusted to tune the threshold voltage to a desirable level. In some embodiments, fluorine ($F^-$) ions are implanted into negatively charged region 44. In alternative embodiments, oxygen ions may be implanted. The implanted impurity may be substantially limited in III-V compound layer 28 in some embodiments. In alternative embodiments, the recessing step for forming recess 35 is not performed, while the implantation for forming negatively charged region 44 is still performed. Photo resist 46 is then removed.

Figure 9:
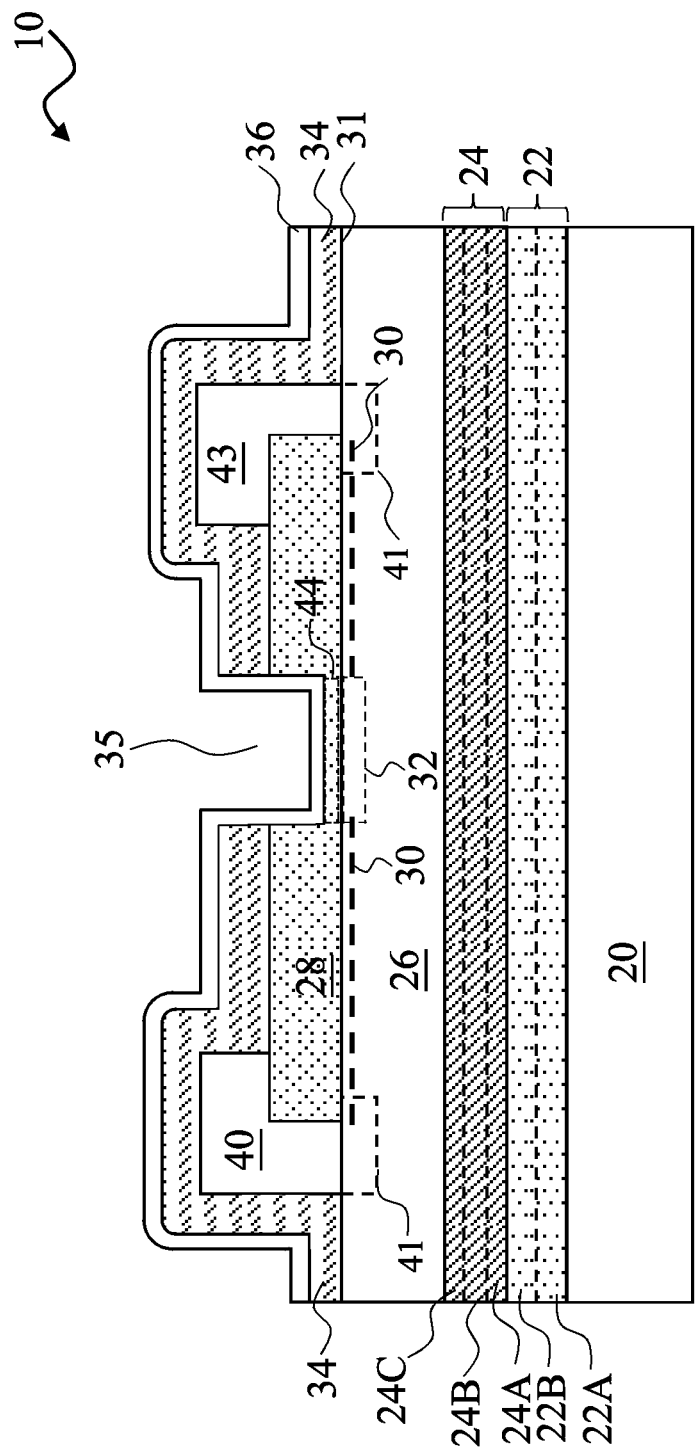

Further referring to FIG. 9, gate dielectric layer 36 is deposited over dielectric passivation layer 34 (step 114 in FIG. 13). Gate dielectric layer 36 also extends into recess 35, and hence includes a portion overlapping and contacting III-V compound layer 28. Furthermore, gate dielectric layer 36 includes portions on the sidewalls of dielectric passivation layer 34, and portions overlapping dielectric passivation layer 34. Gate dielectric layer 36 may reduce a leakage current that flows from the respective gate electrode 38 (FIG. 10) to III-V compound layer 28. The presence of the gate dielectric layer 36 helps suppress any leakage that may occur, which results in a low turn-on voltage for the resulting rectifier.

In some embodiments, gate dielectric layer 36 has a thickness ranging from about 3 nm to about 50 nm. The exemplary materials of gate dielectric layer 36 may be selected from silicon oxide, silicon nitride, gallium oxide, aluminum oxide, scandium oxide, zirconium oxide, lanthanum oxide, hafnium oxide, and combinations thereof. Gate dielectric layer 36 may have an amorphous structure in order to reduce the leakage current flowing through gate dielectric layer 36, wherein the amorphous structure is formed through adjusting process conditions. In some embodiments, gate dielectric layer 36 is formed using Atomic Layer Deposition (ALD). In other embodiments, gate dielectric layer 36 is formed using Plasma Enhanced Chemical Vapor Deposition (PECVD) or LPCVD. After the deposition of gate dielectric layer 36, a post anneal may be performed, for example at a temperature between about 400° C. and about 700° C. The anneal duration may be in the range between about 10 minutes and about 30 minutes. The available methods may include Rapid Thermal Anneal (RTA), for example.

Figure 10:
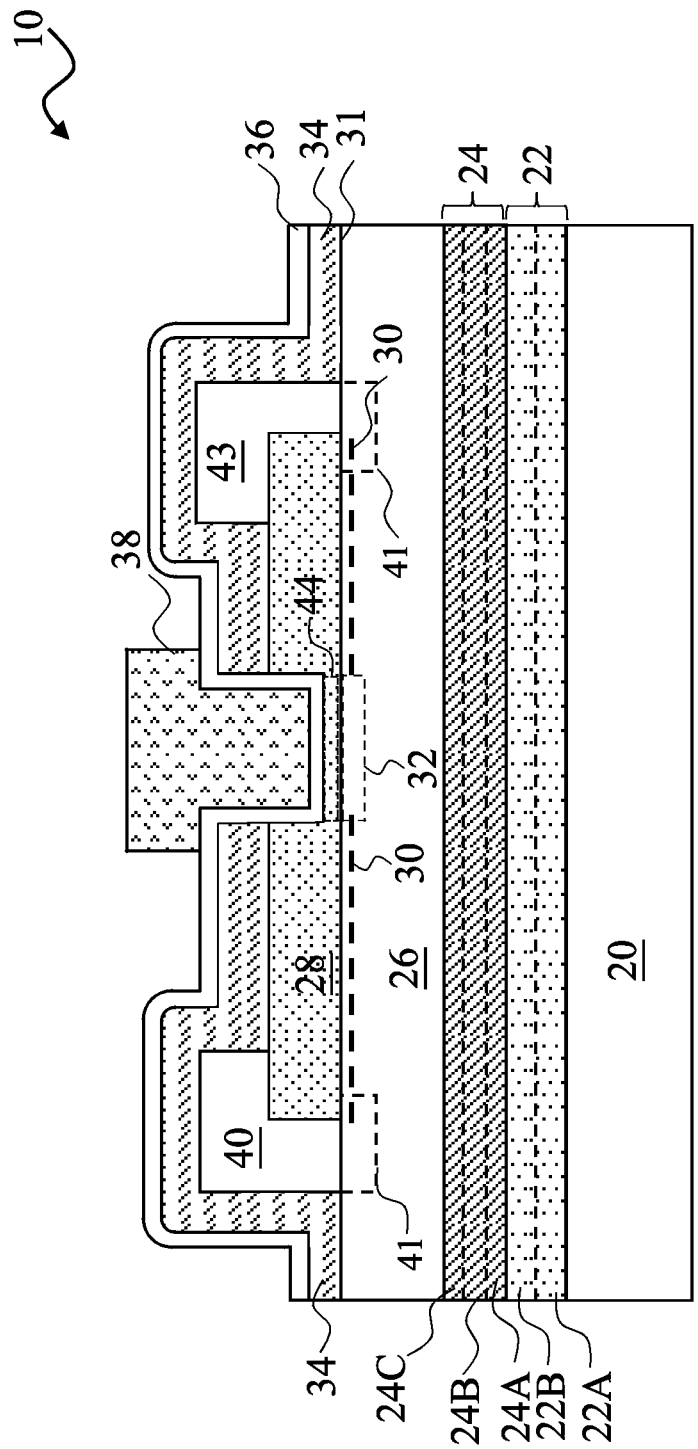

FIG. 10 illustrates a cross-sectional view of wafer 10 after the formation of gate electrode 38 over gate dielectric layer 36 (also step 114 in FIG. 13). Gate electrode 38 comprises a portion extending into opening 35 (FIG. 9), and may further include portions overlapping dielectric passivation layer 34 and gate dielectric layer 36. Gate dielectric layer 36 thus separates gate electrode 38 from dielectric passivation layer 34 and III-V compound layer 28. In some embodiments, the formation of gate electrode 38 includes depositing a blanket gate electrode layer over gate dielectric layer 36 and filling opening 35 as shown in FIG. 9, and performing lithography and etching processes on the gate electrode layer to define gate electrode 38. In some embodiments, gate electrode 38 includes a conductive material that includes a refractory metal or the respective compounds including, e.g., titanium (Ti), titanium nitride (TiN), titanium tungsten (TiW), Tantalum (Ta), Tantalum nitride (TaN), and tungsten (W). In other examples, gate electrode 38 includes nickel (Ni), gold (Au), copper (Cu), or the alloys thereof.

Figure 11:
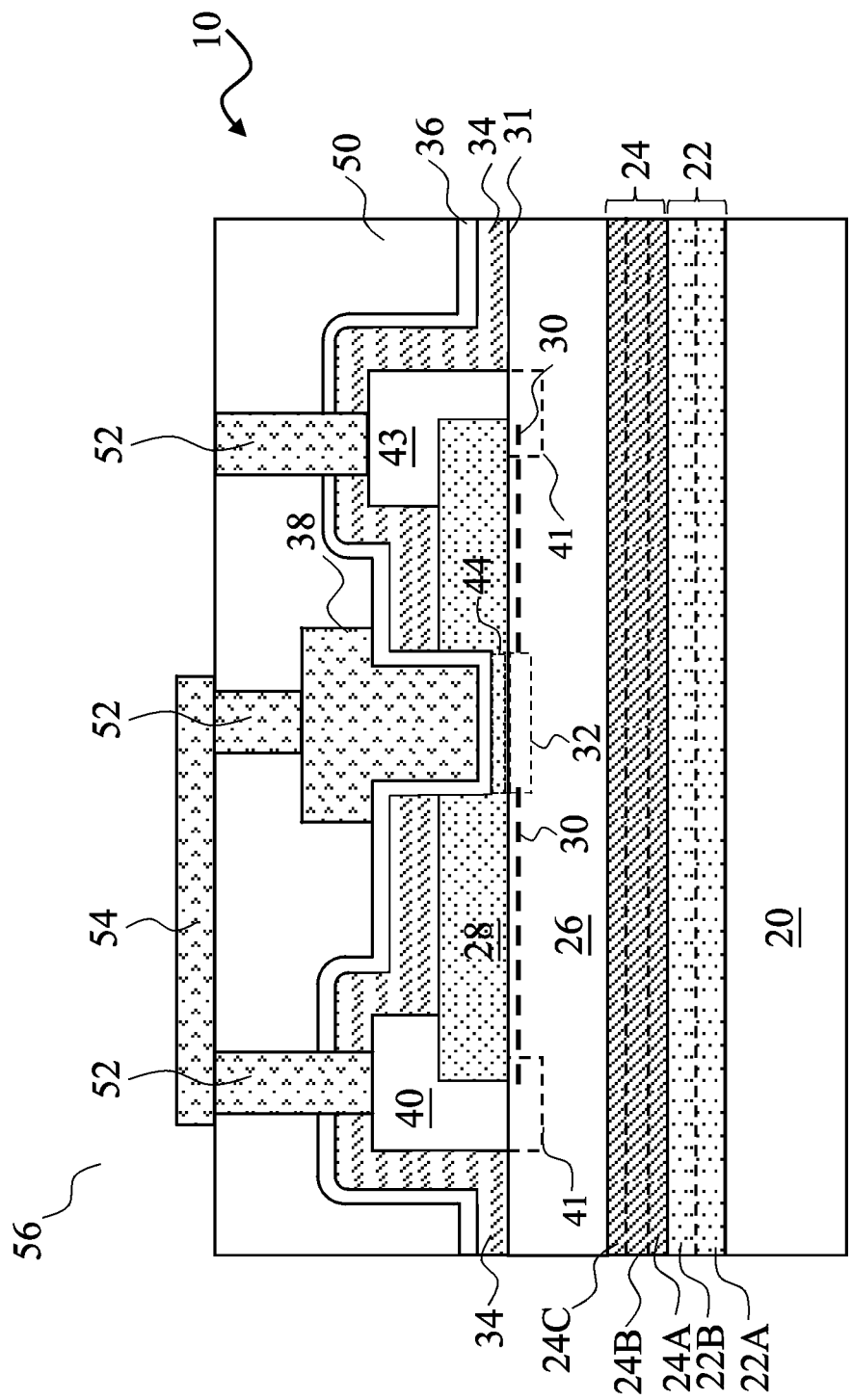

FIG. 11 illustrates the formation of metallic features shorting anode electrode 40 and gate electrode 38. In some embodiments, Inter-Layer Dielectric (ILD) 50 is formed over gate electrode 38 and gate dielectric layer 36. ILD 50 may include silicon carbide, a low-k dielectric material, Phospho-Silicate Glass (PSG), Boro-Silicate Glass (BSG), Boron-Doped Phospho-Silicate Glass (BPSG), Tetra Ethyl Ortho Silicate (TEOS) oxide, or the like. Contact plugs 52 are formed in ILD 50 to connect to anode electrode 40, cathode electrode 43, and gate electrode 38. Metal line 54 is formed to connect to anode electrode 40 and gate electrode 38. Accordingly, anode 40 and gate electrode 38 are electrically connected (and may be electrically shorted) to each other. Rectifier 56 is thus formed.

In accordance with the embodiments of the present disclosure, the introduction of negatively charged region 44 effectively depletes the 2DEG channel portion 32, wherein the depleted portion is overlapped by gate electrode 38. The 2DEG channel portions that on the opposite sides of the depleted channel portion 32, however, still remain. Hence, the 2DEG conduction path between anode electrode 40 and cathode electrode 43 is pinched off. When a positive forward bias voltage is applied to anode electrode 40, the 2DEG channel 30 will be induced in region 32 and the channel starts to be turned on when the bias voltage is higher than the threshold voltage of rectifier 56. When a negative bias voltage is applied to the anode 233, the channel remains off. In rectifier 56, 2DEG channel 30 is a "normally-off" channel, which means that when no bias voltage is applied on gate electrode 38 (or when gate electrode 38 is grounded), the 2DEG channel 30 is turned off.

Figure 12:
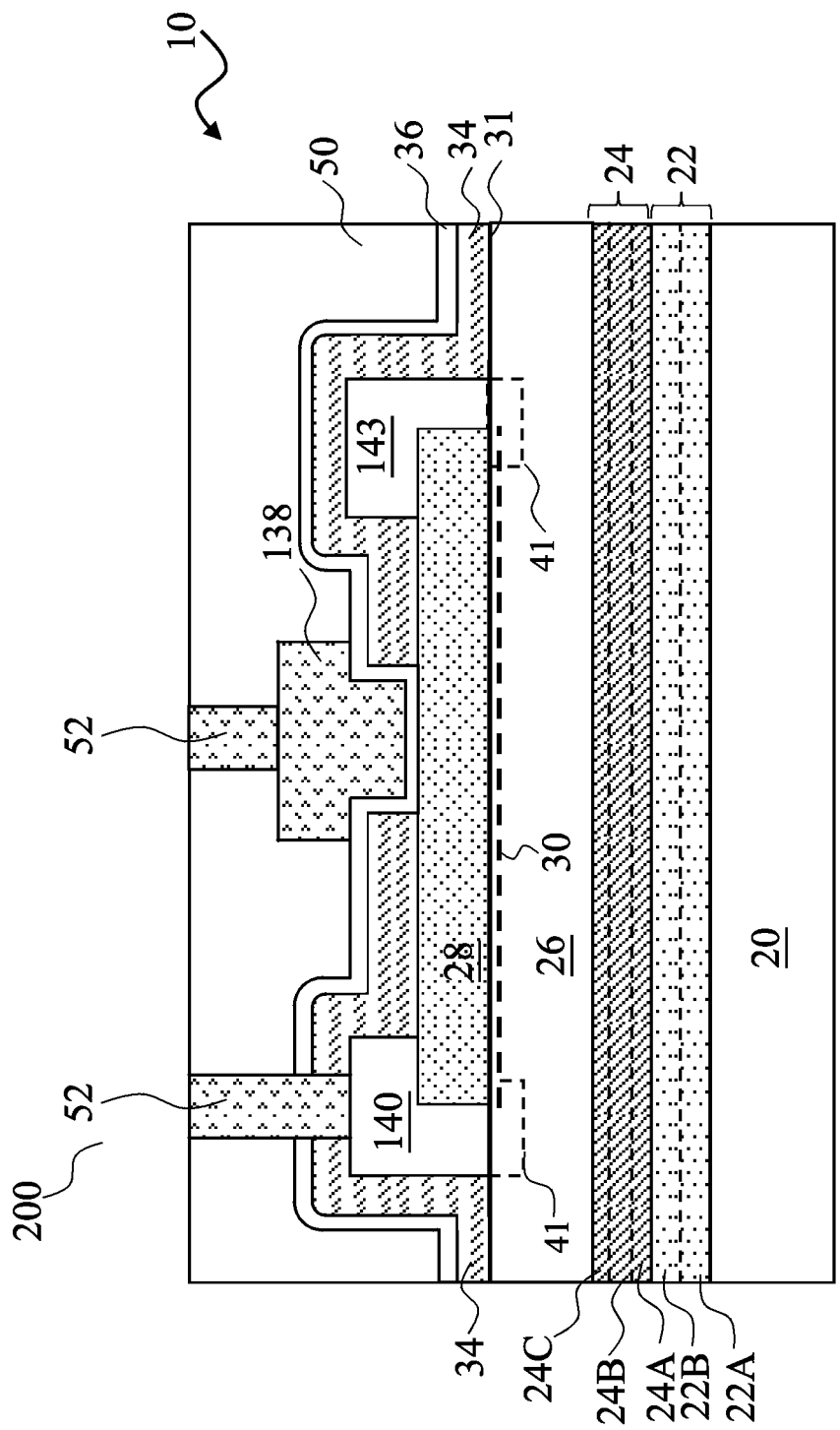
FIG. 12 illustrates the cross-sectional view of a High Electron Mobility Transistor (HEMT) in accordance with some exemplary embodiments, wherein the HEMT and the rectifier are formed on a same substrate and share multiple process steps.

FIG. 12 illustrates HEMT 200, which is formed on the same wafer 10 as rectifier 56 (FIG. 11). HEMT 200 includes source region 140 and drain region 143, and gate electrode 138. As shown in FIG. 12, since no negatively charged region is formed underlying gate electrode 138, and/or III-V compound layer 28 is not recessed, the 2DEG channel 30 is not depleted. Hence, HEMT 200 is a normally-on device, which means that when gate electrode 138 is not biased, 2DEG channel 30 in HEMT 200 is turned on, and connects source region 140 to drain region 143.

HEMT 200 and rectifier 56 are compatible with each other, and hence can share multiple processes. For example, the features that are marked using the same reference notations in FIGS. 11 and 12 are formed simultaneously and share same process steps. As a result, the features that are marked using the same reference notations in FIGS. 11 and 12 are formed of same materials.

In accordance with some embodiments, an integrated circuit device includes a first III-V compound layer, a second III-V compound layer over the first III-V compound layer, a gate dielectric over the second III-V compound layer, and a gate electrode over the gate dielectric. An anode electrode and a cathode electrode are formed on opposite sides of the gate electrode. The anode electrode is electrically connected to the gate electrode. The anode electrode, the cathode electrode, and the gate electrode form portions of a rectifier.

In accordance with other embodiments, an integrated circuit device includes a first III-V compound layer having a first band gap, and a second III-V compound layer overlying and contacting the first III-V compound layer. The second III-V compound layer has a second band gap higher than the first band gap. The second III-V compound layer includes a first portion having a first top surface, and second portions on opposite sides of the first portion, wherein the first top surface is recessed lowered than top surfaces of the second portions to form a recess in the second III-V compound layer. The integrated circuit device further includes a gate electrode over the second III-V compound layer, and an anode electrode and a cathode electrode on opposite sides of the gate electrode. The anode electrode is electrically connected to the gate electrode, and the anode electrode, the cathode electrode, and the gate electrode form portions of a rectifier.

In accordance with yet other embodiments, a method includes epitaxially growing a first III-V compound layer having a first band gap over a substrate, epitaxially growing a second III-V compound layer having a second band gap higher than the first band gap over the first III-V compound layer, and forming an anode electrode and a cathode electrode electrically connected to the second III-V compound layer. A gate dielectric is formed over the second III-V compound layer. A gate electrode is formed over the gate dielectric. The gate electrode and the anode electrode are electrically connected to form a rectifier.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    implanting a first portion of a second III-V compound layer with negatively charged ions, wherein the second III-V compound layer is over a first III-V compound layer, and the first III-V compound layer has a first bandgap different from a second bandgap of the second III-V compound layer, and wherein the second III-V compound layer comprises a second portion and a third portion on opposite sides of the first portion;
    forming a first electrode electrically connected to the second portion of the second III-V compound layer;
    forming a second electrode electrically connected to the third portion of the second III-V compound layer;
    forming a gate dielectric over the first portion of the second III-V compound layer; and
    forming a gate electrode over the gate dielectric.

2. The method of claim 1 further comprising electrically shorting the gate electrode and the first electrode to form a rectifier.

3. The method of claim 1, wherein during the implanting, the second portion and the third portion of the second III-V compound layer are not doped with the negatively charged ions.

4. The method of claim 1 further comprising:
    before the forming the gate dielectric, recessing a portion of the second III-V compound layer to form a recess, wherein when the gate electrode is formed, a remaining portion of the second III-V compound layer remains directly underlying the recess, and the gate dielectric extends into the recess.

5. The method of claim 1, wherein the implanting the first portion of the second III-V compound layer with the negatively charged ions comprises implanting fluorine into the first portion of the second III-V compound layer.

6. The method of claim 1, wherein the implanting the first portion of the second III-V compound layer with the negatively charged ions comprises implanting oxygen into the first portion of the second III-V compound layer.

7. The method of claim 1 further comprising:
    after the forming the second III-V compound layer, forming a dielectric passivation layer over the second III-V compound layer; and
    etching through the dielectric passivation layer, wherein the etching through and the implanting are performed using a same photo resist as masks.

8. The method of claim 1, wherein a Two-Dimensional Electron Gas (2DEG) channel is formed in the first III-V compound layer, and wherein after the gate electrode is formed, the 2DEG channel is at an off state when no bias voltage is applied on the gate electrode.

9. A method comprising:
    epitaxially growing a first III-V compound layer having a first bandgap over a substrate;
    epitaxially growing a second III-V compound layer having a second bandgap different from the first bandgap over the first III-V compound layer;
    forming a patterned mask, with a first portion of the second III-V compound layer exposed to an opening in the patterned mask, and a second portion and a third portion of the second III-V compound layer covered by the patterned mask;
    etching the first portion of the second III-V compound layer using the patterned mask as an etching mask, wherein a recess is formed in the second III-V compound layer;
    removing the patterned mask;
    forming a gate dielectric over the second III-V compound layer, wherein the gate dielectric extends into the recess; and
    forming a gate electrode over the gate dielectric.

10. The method of claim 9, wherein after the etching the first portion of the second III-V compound layer, a top portion of the first portion of the second III-V compound layer is etched, and a bottom portion of the first portion of the second III-V compound layer is left.

11. The method of claim 10 further comprising implanting the bottom portion of the first portion of the second III-V compound layer with negatively charged ions.

12. The method of claim 11, wherein the implanting comprises implanting fluorine.

13. The method of claim 11, wherein the implanting is performed using the patterned mask as an implantation mask.

14. The method of claim 9 further comprising:
forming a first electrode electrically coupled to the second portion of the second III-V compound layer; and
forming a second electrode electrically connected to the third portion of the second III-V compound layer.

15. The method of claim 14 further comprising forming a metal line over and electrically coupling the gate electrode to the first electrode.

16. The method of claim 14 further comprising:
forming a dielectric passivation layer overlapping the second III-V compound layer, the first electrode, and the second electrode; and
etching the dielectric passivation layer to exposed the first portion of the second III-V compound layer using the patterned mask as an etching mask.

17. A method comprising:
forming a dielectric passivation layer over a second III-V compound layer, wherein the second III-V compound layer is over a first III-V compound layer having a bandgap different from a bandgap of the second III-V compound layer;
forming a patterned mask over the second III-V compound layer, wherein a first portion of the second III-V compound layer is overlapped by an opening in the patterned mask, and a second portion and a third portion of the second III-V compound layer are covered by the patterned mask;
etching the dielectric passivation layer and the first portion of the second III-V compound layer using the patterned mask as an etching mask, wherein a recess is formed in the second III-V compound layer;
implanting negatively charged ions into the recess;
removing the patterned mask;
forming a gate dielectric over the second III-V compound layer, wherein the gate dielectric extends into the recess; and
forming a gate electrode over the gate dielectric.

18. The method of claim 17 further comprising:
forming an anode electrode and a cathode electrode electrically connected to the second portion and the third portion, respectively, of the second III-V compound layer, wherein the dielectric passivation layer comprises portions directly over the anode electrode and the cathode electrode; and
electrically shorting the anode electrode and the cathode electrode.

19. The method of claim 17, wherein after the etching the first portion of the second III-V compound layer, a top portion of the first portion of the second III-V compound layer is etched, and a bottom portion of the first portion of the second III-V compound layer is left.

20. The method of claim 19, wherein the negatively charged ions are implanted into the bottom portion of the first portion of the second III-V compound layer.

* * * * *